(12) United States Patent
Wang et al.

(10) Patent No.: US 11,372,177 B2
(45) Date of Patent: *Jun. 28, 2022

(54) PLUGGABLE TRANSCEIVER RETAINER

(71) Applicant: FINISAR CORPORATION, Sunnyvale, CA (US)

(72) Inventors: William H. Wang, Pleasanton, CA (US); Bill S. Wang, San Jose, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/854,502

(22) Filed: Apr. 21, 2020

(65) Prior Publication Data

US 2021/0325615 A1   Oct. 21, 2021

(51) Int. Cl.
  *G02B 6/42*   (2006.01)
  *H05K 5/02*   (2006.01)
  *H04B 10/40*  (2013.01)

(52) U.S. Cl.
  CPC ........... *G02B 6/4261* (2013.01); *H04B 10/40* (2013.01); *H05K 5/0217* (2013.01)

(58) Field of Classification Search
  CPC .... G02B 6/4261; H04B 10/40; H05K 5/0217; H01R 13/62
  See application file for complete search history.

(56) References Cited

U.S. PATENT DOCUMENTS

| | | | |
|---|---|---|---|
| 6,430,053 B1 | 8/2002 | Peterson et al. | |
| 7,040,911 B1* | 5/2006 | Ho | G02B 6/4292 439/352 |
| 7,083,336 B2 | 8/2006 | Kim et al. | |
| 7,114,980 B1 | 10/2006 | Wu | |
| 7,255,484 B2* | 8/2007 | Walker, Jr | G02B 6/4246 385/53 |
| 7,264,406 B1* | 9/2007 | Yoshikawa | G02B 6/4201 385/88 |
| 7,351,090 B1* | 4/2008 | Moore | G02B 6/4246 439/372 |
| 8,794,848 B2* | 8/2014 | Sasaki | G02B 6/4284 385/53 |
| 9,423,579 B2* | 8/2016 | Koutrokois | G02B 6/4277 |
| 9,470,859 B2* | 10/2016 | Arekar | G02B 6/4261 |
| 10,177,494 B1* | 1/2019 | Lu | H01R 13/6275 |
| 10,531,585 B2* | 1/2020 | Luo | G02B 6/42 |
| 10,859,779 B1 | 12/2020 | Wang et al. | |
| 11,079,558 B1* | 8/2021 | Wang | G02B 6/4201 |
| 2002/0150343 A1 | 10/2002 | Chiu et al. | |
| 2003/0198026 A1* | 10/2003 | Bui | G02B 6/3897 361/728 |

(Continued)

*Primary Examiner* — Stephen S Sul
(74) *Attorney, Agent, or Firm* — Blank Rome LLP

(57) ABSTRACT

In an example, an optoelectronic module may include a housing enclosing at least one optical transmitter or receiver and a slider configured to move with respect to the housing. The slider may include at least one protrusion configured to engage a cage sized and shaped to receive the housing. The optoelectronic module may include a bail rotatably coupled to the housing, and the bail may be configured to actuate the slider when the bail is rotated. The optoelectronic module may include a retainer configured to engage with the housing and the bail to retain the bail in a fixed position with respect to the housing.

24 Claims, 7 Drawing Sheets

(56) References Cited

U.S. PATENT DOCUMENTS

| | | | | |
|---|---|---|---|---|
| 2003/0214789 A1* | 11/2003 | Medina | G02B 6/4246 | |
| | | | 361/729 | |
| 2004/0033027 A1* | 2/2004 | Pang | G02B 6/3825 | |
| | | | 385/53 | |
| 2004/0161958 A1* | 8/2004 | Togami | H01R 13/6275 | |
| | | | 439/160 | |
| 2005/0148223 A1* | 7/2005 | Shirk | G02B 6/4246 | |
| | | | 439/160 | |
| 2005/0158051 A1 | 7/2005 | Dodds | | |
| 2005/0226587 A1* | 10/2005 | Minota | G02B 6/4292 | |
| | | | 385/134 | |
| 2005/0226626 A1* | 10/2005 | Zhang | G02B 6/4292 | |
| | | | 398/135 | |
| 2006/0215968 A1* | 9/2006 | Kayner | G02B 6/4284 | |
| | | | 385/89 | |
| 2006/0252311 A1* | 11/2006 | Togami | H05K 9/0058 | |
| | | | 439/607.2 | |
| 2007/0042613 A1* | 2/2007 | Yoda | B41J 2/161 | |
| | | | 439/34 | |
| 2007/0243749 A1 | 10/2007 | Wu | | |
| 2008/0031577 A1* | 2/2008 | Walker | G02B 6/4246 | |
| | | | 385/92 | |
| 2008/0089649 A1* | 4/2008 | Wang | G02B 6/4246 | |
| | | | 385/56 | |
| 2009/0209125 A1 | 8/2009 | Bright et al. | | |
| 2009/0279831 A1 | 11/2009 | Luo et al. | | |
| 2010/0067199 A1* | 3/2010 | Chen | G02B 6/4261 | |
| | | | 361/747 | |
| 2010/0098385 A1* | 4/2010 | Minota | G02B 6/4201 | |
| | | | 385/92 | |
| 2011/0170832 A1* | 7/2011 | Yamai | G02B 6/4261 | |
| | | | 385/92 | |
| 2011/0267742 A1 | 11/2011 | Togami et al. | | |
| 2013/0115800 A1 | 5/2013 | Chan | | |
| 2014/0029895 A1* | 1/2014 | Sasaki | G02B 6/4246 | |
| | | | 385/53 | |
| 2014/0254993 A1 | 9/2014 | Koutrokois | | |
| 2015/0117819 A1* | 4/2015 | Chou | G02B 6/4278 | |
| | | | 385/76 | |
| 2015/0241646 A1* | 8/2015 | Wang | G02B 6/4292 | |
| | | | 385/92 | |
| 2015/0343769 A1* | 12/2015 | Yoda | B41J 2/1623 | |
| | | | 347/50 | |
| 2016/0252691 A1* | 9/2016 | Arekar | G02B 6/4292 | |
| | | | 385/92 | |
| 2019/0212509 A1* | 7/2019 | Takeuchi | G02B 6/4292 | |
| 2019/0312645 A1 | 10/2019 | Ishii et al. | | |
| 2020/0183106 A1* | 6/2020 | Lun | G02B 6/4278 | |

* cited by examiner

PLUGGABLE TRANSCEIVER RETAINER

FIELD

The present disclosure relates to retainers for optoelectronic modules.

BACKGROUND

Unless otherwise indicated herein, the materials described herein are not prior art to the claims in the present application and are not admitted to be prior art by inclusion in this section.

Optoelectronic modules, such as transceivers, may be used to transmit data between different devices or different locations. In particular, optical signals may be used to rapidly communication data (via the optical signals) between different devices or different locations. However, most electronic devices operate using electrical signals. Accordingly, optoelectronic modules may be used to convert optical signals to electrical signals or convert electrical signals to optical electrical, so optical signals may be used to transmit data between electronic devices. Optoelectronic modules typically communicate with a host device by transmitting electrical signals to the host device and receiving electrical signals from the host device. These electrical signals may then be transmitted by the optoelectronic module as optical signals.

One type of host device that may be implemented with optoelectronic modules is a network switch. A network switch may include multiple ports or cages to receive optoelectronic modules. In some configurations, the optoelectronic modules may include a coupling mechanism such as a latch to retain the optoelectronic modules in their respective ports or cages in the network switch. The coupling mechanism may also permit the optoelectronic modules to be removed from the ports or cages. However, in some circumstances, an optoelectronic module may unintentionally disengage from its port or cage.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In an example, an optoelectronic module may include a housing enclosing at least one optical transmitter or receiver and a slider configured to move with respect to the housing. The slider may include at least one protrusion configured to engage a cage sized and shaped to receive the housing. The optoelectronic module may include a bail rotatably coupled to the housing and the bail may be configured to actuate the slider when the bail is rotated. The optoelectronic module may include a retainer configured to engage with the housing and the bail to retain the bail in a fixed position with respect to the housing.

The retainer may include a protrusion configured to engage with a surface of the housing. The retainer may include a protrusion configured to abut the bail when the retainer is engaged with the housing. The protrusion abutting the bail may prevent the bail from rotating.

The retainer may include a body portion extending between two oppositely positioned sides. The retainer may include a first protrusion and a second protrusion, positioned on the sides of the retainer. The first protrusion and the second protrusion may extend transverse to the sides of the retainer. At least the first protrusion may extend parallel to the body portion. The first protrusion and the second protrusion may extend towards an interior of the retainer. The first protrusion may disable a release mechanism of the slider when engaged with the bail by preventing the bail from rotating.

The retainer may abut a portion of the bail when the retainer is engaged with the housing to retain both the bail and the slider in a fixed position with respect to the housing. The retainer may prevent the bail from rotating when the retainer is engaged with the housing and consequently prevents the slider from moving with respect to the housing to an unlocked position.

The retainer may include a planar material bent into a u-shaped configuration, and the retainer may be formed of a resilient material to permit the retainer to be engaged with the housing and the bail. The retainer may disable a release mechanism of the slider when engaged with the housing and the bail. The retainer may be sized and shaped to surround at least a portion of both the bail and the slider in an engaged position.

The slider may be configured to move in a direction parallel to a longitudinal axis of the housing. The slider may include at least one arm extending along the housing and a protrusion positioned on the arm. The protrusion may be configured to engage a corresponding resilient tab of a cage.

In another example, a method may include spreading apart sides of a retainer. The sides of the retainer may be coupled to one another by a body portion. The method may include positioning a first protrusion of the retainer against a surface of a housing of an optoelectronic module. The method may include abutting a second protrusion against a bail of the optoelectronic module. The retainer may retain the bail with respect to the housing. Abutting the retainer against the bail of the optoelectronic module may prevent the bail from rotating thereby disabling a slider coupled to the bail. The second protrusion of the retainer may abut a handle of the bail to prevent the bail from rotating. The method may include surrounding at least a portion of the housing and the bail by the retainer.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Figure 1A:
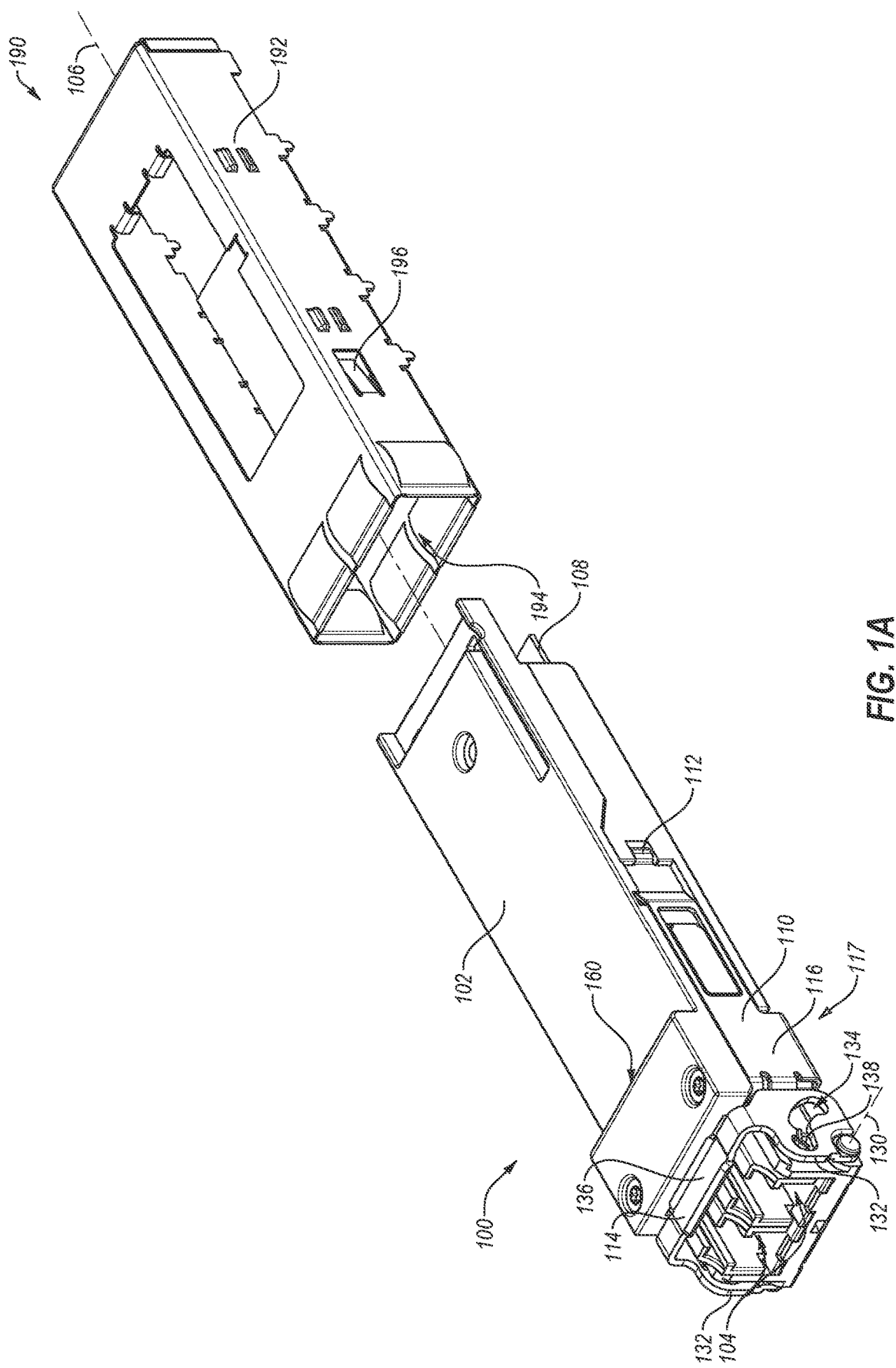
FIG. 1A is a perspective view of an optoelectronic module and a cage.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

The present disclosure generally relates to retainers for optoelectronic modules, which may be implemented to prevent optoelectronic modules from unintentionally disengaging from a host device such as a network switch.

A network switch or other type of host device may be implemented to mechanically retain and communicatively couple multiple optoelectronic modules in a network. The network switch may include multiple ports or cages sized and shaped to receive optoelectronic modules. The optoelectronic modules may convert electrical signals to optical signals, or vice versa, to permit the optoelectronic modules to communicate with other network devices via optical signals. The optoelectronic modules may be communicatively coupled to the network switch, for example, to a printed circuit board assembly (PCBA) of the network switch, to permit the network switch to communicate with the other network devices.

In some configurations, the network switch and the optoelectronic modules may include a coupling mechanism such as a latch to retain the optoelectronic modules in their respective cages in the network switch. This coupling mechanism may also permit the optoelectronic modules to be removed from the cages of the network switch. However, in some circumstances, an optoelectronic module may unintentionally disengage from its cage. Accordingly, the described embodiments include retainers for optoelectronic modules, which may be implemented to prevent optoelectronic modules from unintentionally disengaging from the cages in a network switch.

Typically network switches may be shipped or distributed without optoelectronic modules positioned therein. Such configurations may be implemented, for example, to avoid damage to the optoelectronic modules during transport. However, in some circumstances it may be desirable to distribute network switches populated with optoelectronic modules. In particular, it may be desirable to ship network switches with optoelectronic modules positioned in at least some of the cages of the network switches. However, during movement associated with shipping the optoelectronic modules may come loose or be shaken out of their respective cages. Furthermore, a release mechanism of an optoelectronic module may be unintentionally activated during shipping.

Optoelectronic modules that unintentionally disengage from their respective cages may result in damage to the optoelectronic modules or the network switch. Accordingly, the disclosed embodiments may include retainers to prevent optoelectronic modules from unintentionally releasing from the cages of the network switch, for example, during shipping. In particular, the disclosed embodiments may deactivate or disable a release mechanism of the optoelectronic module, thereby preventing the optoelectronic module from being removed from the cage of the network switch.

FIG. 1A illustrates an example of an optoelectronic module 100 and a corresponding cage 190. In particular, FIG. 1A is a perspective view of the optoelectronic module 100 and the cage 190. As illustrated, the optoelectronic module 100 includes a housing 102 which may enclose optical, electrical and optoelectronic components positioned therein. For example, the optoelectronic module 100 may include optoelectronic components such optical transmitters (e.g. lasers, etc.) and optical receivers (e.g., photodiodes, etc.) to convert electrical signals to optical signals and optical signals to electrical signals. The optoelectronic module 100 may also include corresponding optics such as lenses, collimators, filters, isolators, and the like to direct and modulate optical signals travelling to and from the optoelectronic components. The optoelectronic module 100 may include any suitable electrical components, such as drivers to drive the optical transmitters, amplifiers to amplify signals from the optical receivers, controllers to control the operation of the optoelectronic module 100 and the like. The above-mentioned optoelectronic, optical, and electrical components may be at least partially enclosed in a housing.

As illustrated, the optoelectronic module 100 may include one or more ports 104 to mechanically and optically couple the optoelectronic module 100 to optical fibers. The ports 104 may be sized and shaped to receive a connector of the optical fiber, such as ferrule or other suitable coupler. In the illustrated configuration, the optoelectronic module 100 includes two ports 104, which corresponds to two optical fibers, although any suitable configuration may be implemented. In the illustrated configuration, the optoelectronic module 100 extends along a longitudinal axis 106 and the optical fibers may be inserted into the ports 104 in a direction parallel to the longitudinal axis 106.

When optical fibers are coupled to the optoelectronic module 100, the optoelectronic module 100 may send and receive optical signals with other components in a network. The optoelectronic module 100 may include an electrical coupling 108 such as an edge connector to electrically couple the optoelectronic module 100 to a host device. Accordingly, the optoelectronic module 100 may permit the host device to communicate with other components in the network by converting electrical signals to optical signals to be transmitted to the other components in the network, and converting received optical signals to electricals signals to be used by the host device.

The cage 190 may include a body 192 defining an opening 194 sized and shaped to receive the optoelectronic module 100 (or the housing 102 of the optoelectronic module 100). The cage 190 may be included in a host device to mechanically and electrically couple the optoelectronic module 100. In particular, the cage 190 may receive and retain the optoelectronic module 100 in the opening 194. Furthermore, the host device may include an electrical coupling such as a socket that corresponds to the electrical coupling 108 of the optoelectronic module 100. The socket may receive the edge connector of the optoelectronic module 100 to electrically couple the optoelectronic module 100 to the host device.

Although the illustrated configuration includes one cage 190, the host device may include any suitable number of cages to interface with multiple optoelectronic modules. For example, if the host device is a fiber optic network switch, it may include configurations of 4, 8, 12, 24, 32, 48, 64 ports or any other suitable number of ports and corresponding optoelectronic modules.

The optoelectronic module 100 and the cage 190 may include a coupling mechanism to retain the optoelectronic module 100 with respect to the cage 190. In particular the cage 109 may include resilient tabs 196 and the optoelectronic module 100 may include a slider 116 with arms 110 configured to engage with the tabs 196 of the cage 190 to prevent removal of the optoelectronic module 100 from the cage 190. In particular, the arms 110 may include protrusions 112 that engage the tabs 196 of the cage 190 thereby preventing movement of the optoelectronic module 100, for example, in a direction parallel to the longitudinal axis 106. The slider 116 and the arms 110 may move with respect to the housing 102 of the optoelectronic module 100, in a direction parallel to the longitudinal axis 106, to engage or disengage the protrusions 112 with respect to the tabs 196. As shown, the arms 110 extend along the housing 102 in a direction parallel to the longitudinal axis 106.

The optoelectronic module 100 may include a bail 114 coupled to the slider 116 to permit a user to move the slider 116 in a direction parallel to the longitudinal axis 106 to engage or disengage the optoelectronic module 100 with respect to the cage 190. In the illustrated configuration, the bail 114 is rotatably coupled to the housing 102 of the optoelectronic module 100 proximate the ports 104. In particular, the bail 114 may rotate about an axis of rotation 130 with respect to the optoelectronic module 100. The bail 114 may include sides 132 that extend laterally along the sides of the optoelectronic module 100 (e.g., the housing 102 proximate the ports 104)), and a handle 136 extending between the sides 132. The handle 136 may be sized and shaped to be grasped or otherwise manipulated by the user, for example, to rotate the bail 114 with respect to the housing 102 of the optoelectronic module 100. As shown, the bail 114 may include a substantially u-shaped configuration or cross-section, with the sides 132 and the handle 136 cooperatively surrounding a portion of the housing 102 and the ports 104 of the optoelectronic module 100. However, other configurations may be implemented according to the concepts described herein.

The sides 132 of the bail 114 may define an opening 134 sized and shaped to receive a coupling member 138 of the slider 116. The coupling member 138 may be positioned on each of the arms 110 of the slider 116, and the opening 134 may be positioned on the sides 132 of the bail 114. Therefore, the slider 116 may include two coupling members 138 (e.g., one on each side, and the bail 114 may include corresponding openings 134 (e.g., one on each side).

The openings 134 may be sized and shaped such that the coupling members 138 abut the sides of the openings 134 so the bail 114 may move the slider 116. In such configurations, when the bail 114 is rotated (e.g., when the handle 136 of the bail 114 is rotated away from the cage 190 or the electrical coupling 108), the slider 116 may be displaced (e.g., moved or slid) with respect to the housing 102, in a direction parallel to the longitudinal axis 106 (e.g., away from the cage 190 or the electrical coupling 108).

Figure 1B:
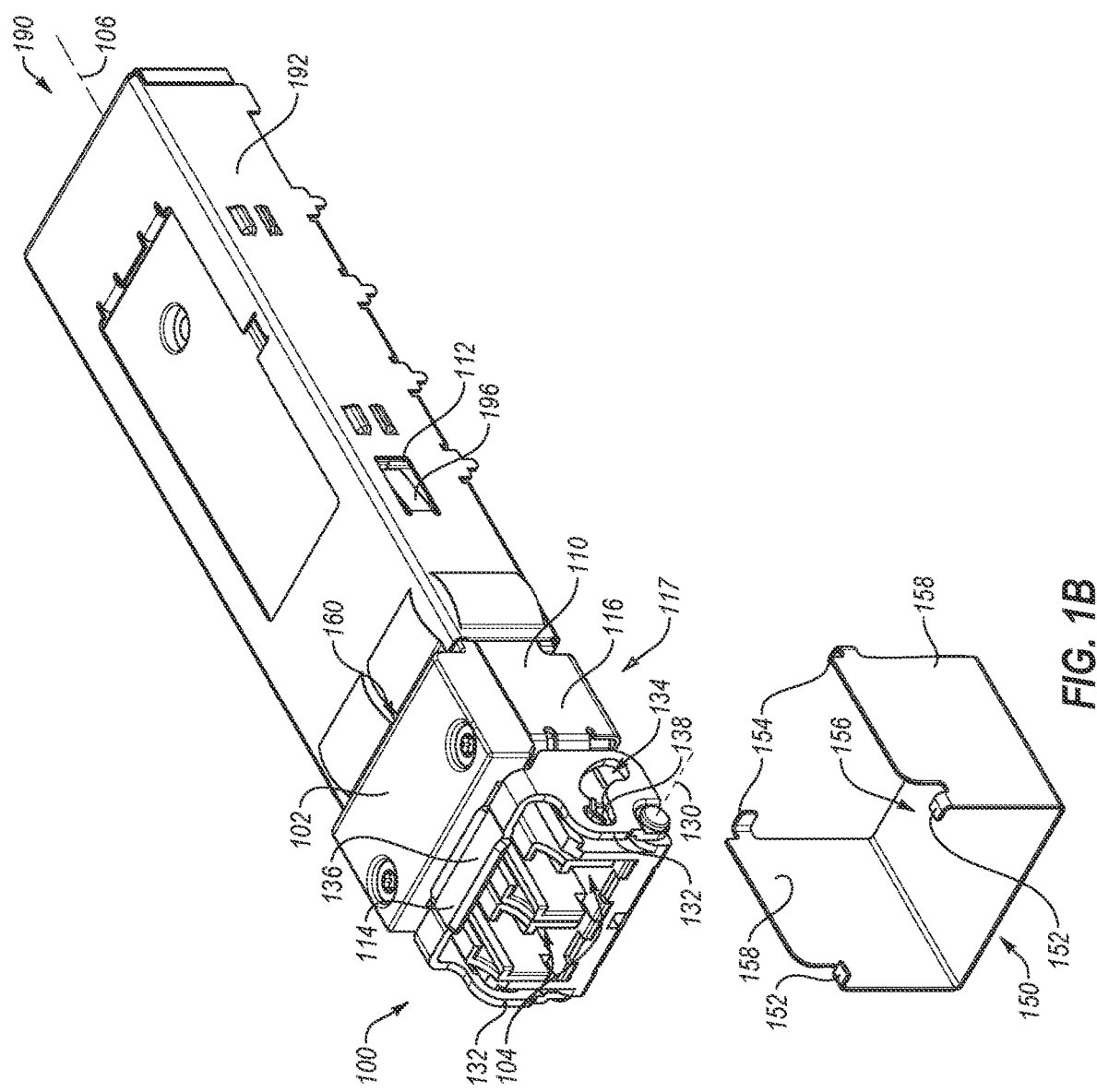
FIGS. 1B-1C are perspective views of the optoelectronic module positioned inside of the cage and a retainer.
Figure 1C:
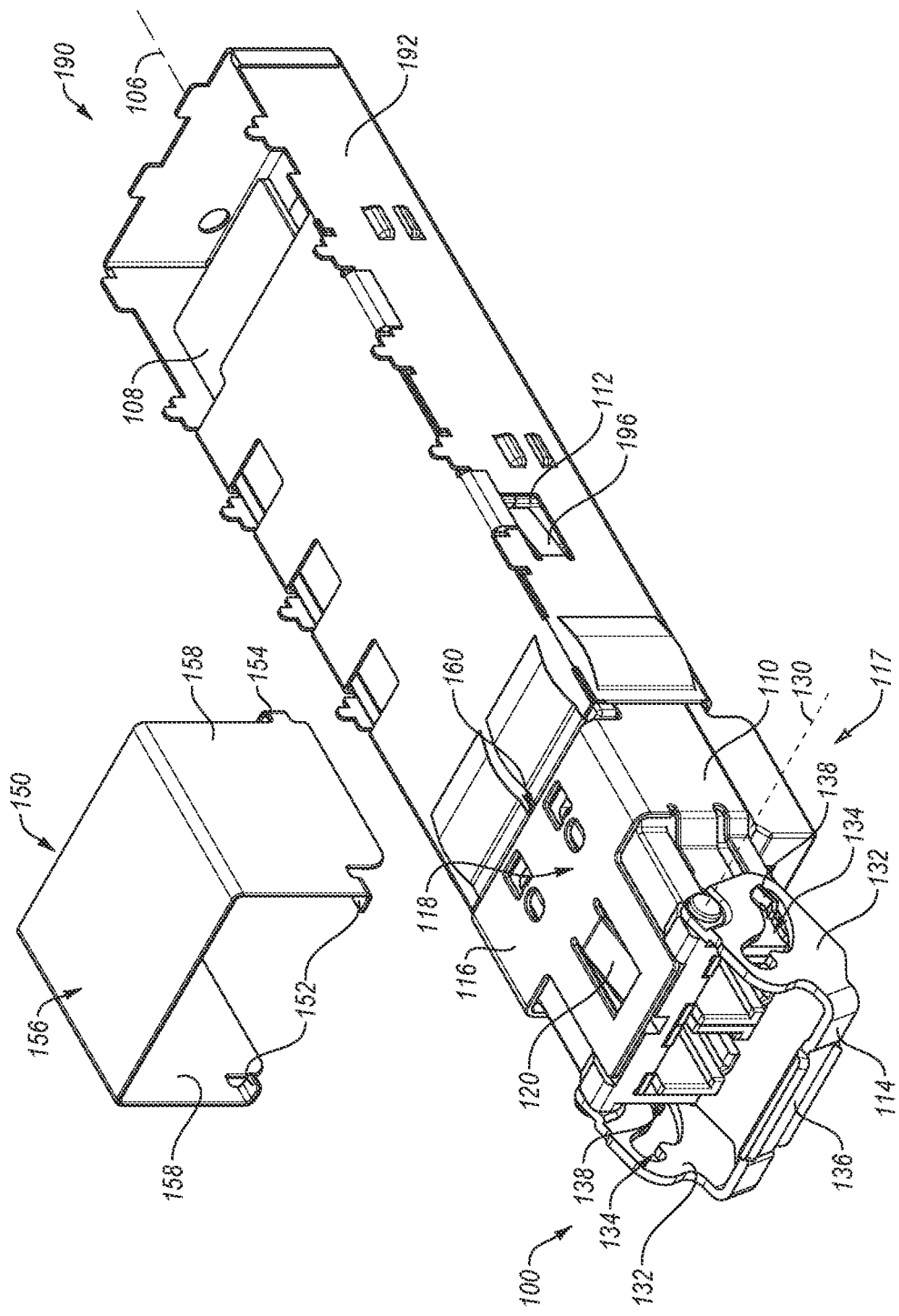

FIGS. 1B and 1C are perspective views of the optoelectronic module 100 positioned inside of the cage 190. As shown, the optoelectronic module 100 may be inserted in the opening 194 and slid into the cage 190 until the housing 102 abuts the cage 190. Once the optoelectronic module 100 is positioned in the cage 190, the protrusions 112 may engage the tabs 196 to prevent the optoelectronic module 100 from being removed from the cage 190, as shown. Since the tabs 196 are resilient, they may be displaced by the protrusions 112 as the optoelectronic module 100 is inserted into the cage 190, until the protrusions 112 move beyond and abut the ends of the tabs 196, in the engaged position shown.

In addition, FIGS. 1B-1C illustrate a retainer 150. The retainer 150 may be implemented to prevent the optoelectronic module 100 from unintentionally disengaging from the cage 190. Thus, the retainer 150 may avoid damage to the optoelectronic module 100 during transport.

As will be described in further detail below, the retainer 150 may be configured to deactivate or disable a release mechanism 117 of the optoelectronic module 100, thereby preventing the optoelectronic module 100 from unintentionally releasing from the cage 190. Such configurations may permit network switches to be shipped with optoelectronic modules positioned in the cages, without the optoelectronic modules coming loose of their respective cages. Accordingly, the retainer 150 may prevent damage to the optoelectronic module 100 or the network switch during shipping.

As explained above, the slider 116 may move with respect to the housing 102 of the optoelectronic module 100 in a direction parallel to the longitudinal axis 106 to engage or disengage the protrusions 112 with respect to the tabs 196. Furthermore, the bail 114 is coupled to the slider 116 to permit a user to move the slider 116 in a direction parallel to the longitudinal axis 106 to engage or disengage the optoelectronic module 100 with respect to the cage 190. In the position shown in FIG. 1B, the slider 116 is in an engaged or locked position, with the slider 116 positioned towards the electrical coupling 108 along the longitudinal axis 106. In this position, the bail 114 is also rotated towards the electrical coupling 108, with the bail 114 abutting the housing 102, for example, as shown in FIG. 1B.

In the position shown in FIG. 1C, the bail 114 and the slider 116 are in a disengaged or unlocked position, with the bail 114 rotated away from the optoelectronic module 100. In the disengaged or unlocked position, the slider 116 may be positioned further from the electrical coupling 108 along the longitudinal axis 106. In this position, the protrusions 112 of the slider 116 may disengage the tabs 196 of the cage 190 to permit the optoelectronic module 100 to be removed from the cage 190. In particular, the protrusions 112 may displace the tabs 196 in a direction away from the optoelectronic module 100, permitting the slider 116 and the protrusions 112 to move past the tabs 196, for example, to permit the optoelectronic module 100 to be removed from the cage 190. A user may move the slider 116 to the disengaged or unlocked position by rotating the bail 114 (e.g., by pulling on the handle 136 of the bail 114), which is coupled to the slider 116. Thus, when a user rotates the bail 114, the slider 116 may be moved to the disengaged or unlocked position shown in FIG. 1C, thereby permitting the protrusions 112 of the slider 116 to move past the tabs 196.

The bail 114 and the slider 116 may not move beyond the disengaged or unlocked position, so when the user continues to pull on the bail 114 (e.g., the handle 136 of the bail 114), the entire optoelectronic module 100 will be pulled along with the bail 114, thereby pulling the optoelectronic module 100 from the cage 190. In practice, the when the user pulls on the bail 114, the optoelectronic module 100 may be removed from the cage 190, with the bail 114 first being rotated to displace the slider 116 into the disengaged or unlocked position and then the optoelectronic module 100 being pulled from the cage 190 by the bail 114.

Figure 1D:
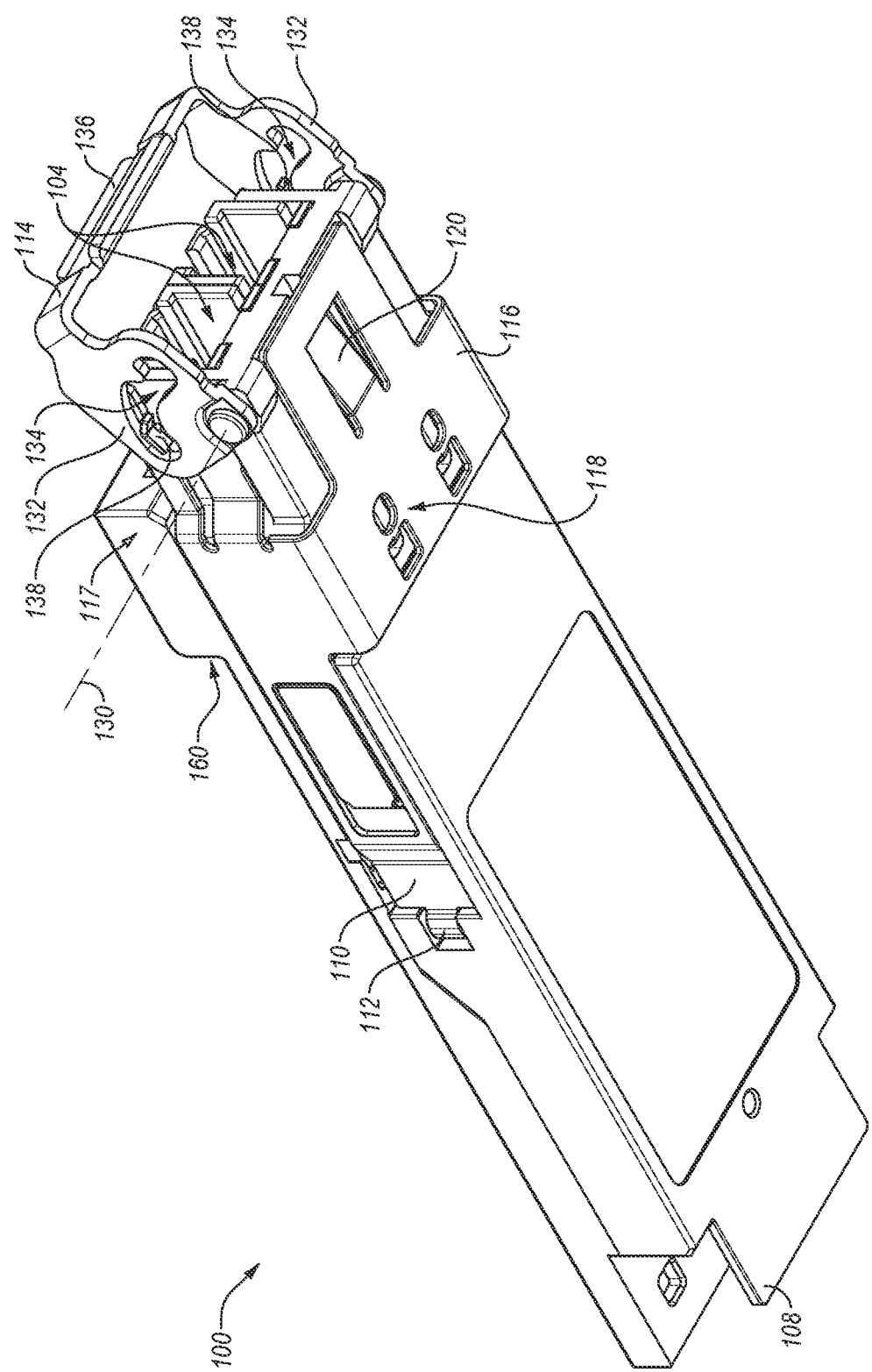
FIG. 1D is another perspective view of the optoelectronic module.

FIG. 1D is a perspective view of the optoelectronic module 100 removed from the cage 190. In particular, FIG. 1D illustrates the optoelectronic module 100 after the user rotates the bail 114 to disengage the slider 116, and pulls on the handle 136 of the bail 114 to remove the optoelectronic module 100 from the cage 190.

As shown in FIG. 1D, the slider 116 includes a resilient tab 120 that generally extends towards a direction parallel to the longitudinal axis 106 and is biased towards the housing 102 of the optoelectronic module 100. The resilient tab 120 may be positioned on a lateral portion 118 of the slider 116, which extends between and is coupled to the arms 110. While the arms 110 extend along two opposite facing sides of the optoelectronic module 100, the lateral portion 118 may extend perpendicular to the arms 110, as shown. In the illustrated configuration, the lateral portion 118 and the arms 110 are integral with the slider 116, and form a u-shaped slider member (e.g., having a u-shaped cross-section). In such circumstances, the slider member may include two arm portions (e.g., arms 110) and the lateral portion 118 extending therebetween. However, other suitable configurations may be implemented.

The retainer 150 may be configured to prevent the bail 114 from being moved with respect to the housing 102 or the rest of the optoelectronic module 100 (e.g., in the longitudinal direction) to the disengaged or unlocked position. This in turn prevents the slider 116 from releasing the optoelectronic module 100, to prevent the optoelectronic module 100 from being removed from the cage 190 (e.g., as shown in FIG. 1D), and from unintentional release from the cage 190.

Figure 2:
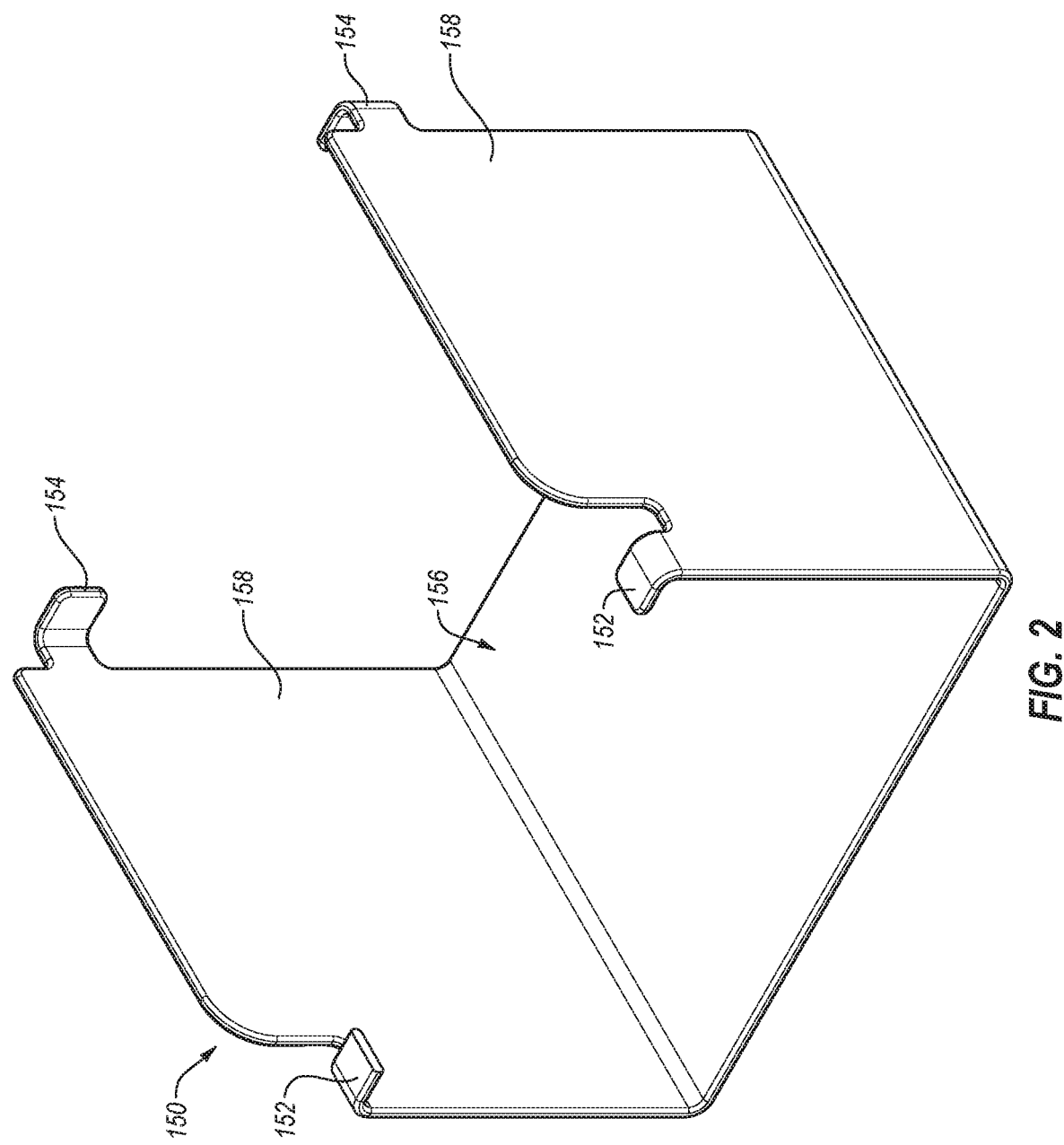
FIG. 2 is a perspective view of the retainer.

FIG. 2 is a perspective view of the retainer 150. The retainer 150 may include protrusions 154 to engage with the housing 102 of the optoelectronic module 100 and protrusions 152 to engage with the housing 102 abut the handle 136 of the bail 114, to prevent the bail 114 from being moved with respect to the housing 102. In turn, since the bail 114 is coupled to the slider 116, the retainer 150 also prevents the slider 116 from moving with respect to the housing 102 in a direction parallel to the longitudinal axis 106 to the disengaged or unlocked position (e.g., in a direction away from the electrical coupling 108).

As shown, the retainer 150 may be formed of or may include a sheet of generally planar material bent into a u-shaped configuration to retain the slider 116 with respect to the housing 102. The retainer 150 may include a body portion 156 extending between two oppositely positioned sides 158 of the retainer 150. In the illustrated configuration, the body portion 156 is generally planar and the sides 158 extend transverse or perpendicular to the body portion 156 and are also planar. The body portion 156 may be sized and shaped to generally corresponding to the lateral portion 118 of the slider 116. In particular, the body portion 156 may include at least one dimension that is substantially the same as a corresponding dimension of the lateral portion 118 of the slider 116.

The protrusions 152 may be positioned on the sides 158 and may extend transverse or perpendicular to the sides 158, in a direction towards the interior of the retainer 150 (e.g., generally towards the center of the "u" defined by the retainer 150). The protrusions 154 may also be positioned on the sides 158 of the retainer 150 and may extend transverse or perpendicular to the sides 158 (e.g., in a direction parallel to the body portion 156). The protrusions 154 may also extend in a direction towards the interior of the retainer 150 (e.g., generally towards the center of the "u" defined by the retainer 150). However, the protrusions 154 and the protrusions 152 may also extend transverse or perpendicular to one another.

As shown, for example, in FIG. 1B, the housing 102 may define a surface 160 that may engage with the protrusion 152. In the illustrated configuration, the surface 160 extends perpendicular or transverse to the longitudinal axis 106, for example, in a vertical direction. As shown, the surface.

The retainer 150 may be formed of a resilient material (such as a resilient metal material) to permit the retainer 150 to engage and disengage the optoelectronic module 100. In particular, the retainer 150 may be bent or otherwise manipulated to permit the retainer 150 to be positioned around the slider 116, a portion of the bail 114 and a portion of the housing 102. Once positioned to engage the optoelectronic module 100, the retainer 150 may return to its original shape as it retains the slider 116 in the engaged or locked position with respect to the housing 102, with the protrusions 152, 154 engaged with the optoelectronic module 100.

Figure 3A:
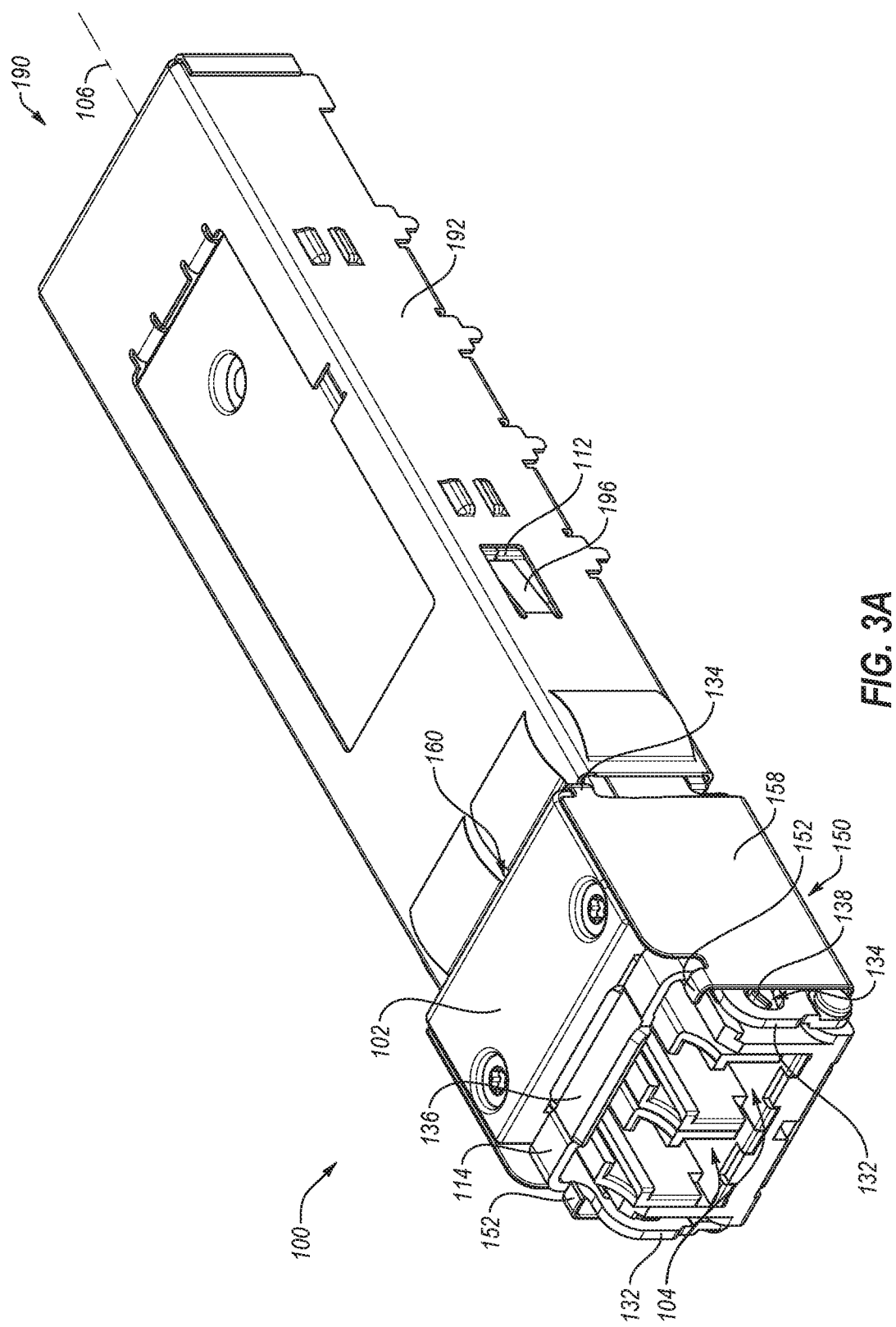
FIG. 3A is a perspective view of the retainer engaged with the optoelectronic module.
Figure 3B:
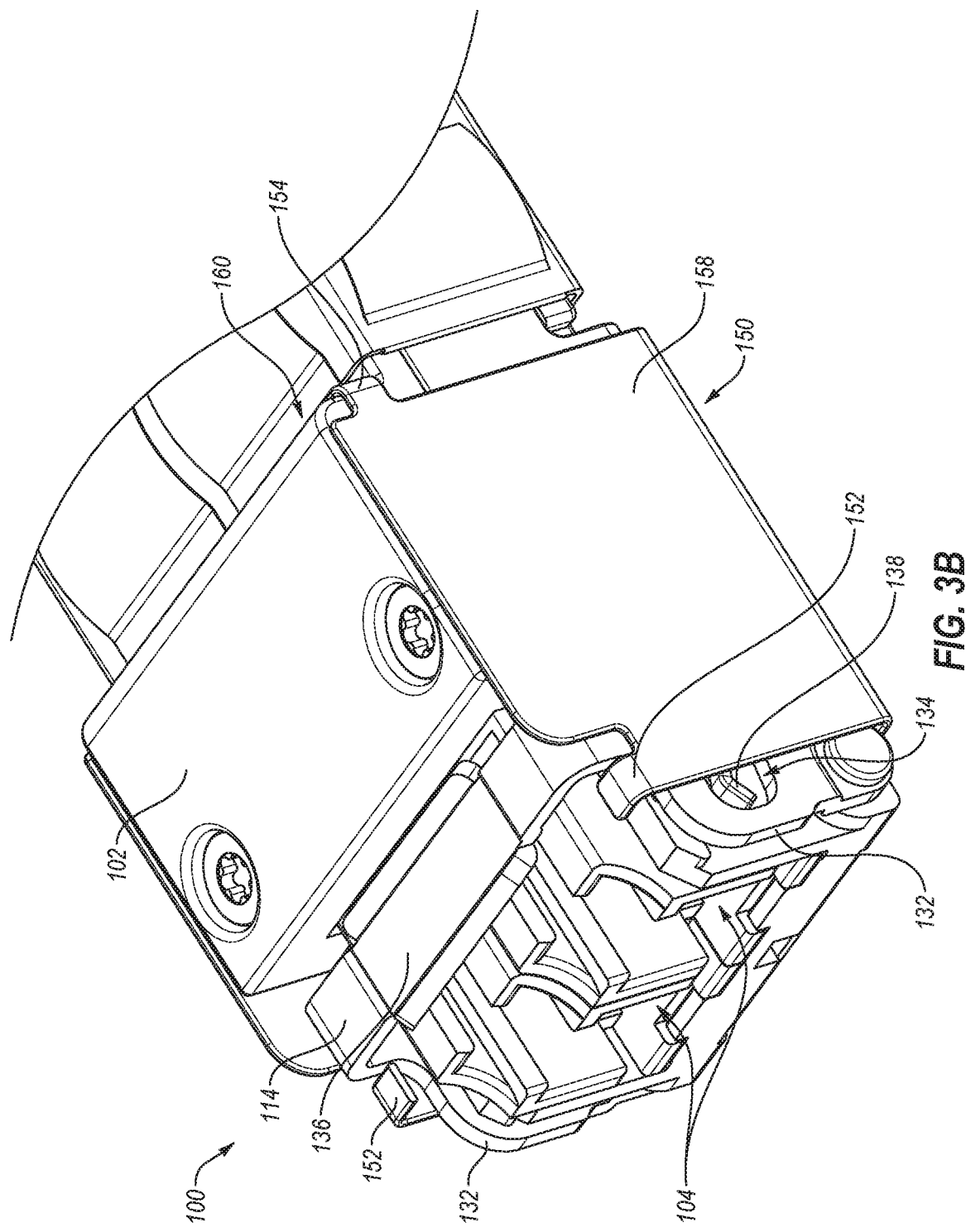
FIG. 3B is a perspective view of a portion of the optoelectronic module engaged with the retainer.

FIGS. 3A and 3B are views of the retainer 150 engaged with the optoelectronic module 100. In particular, FIG. 3A is a perspective view of the retainer 150 engaged with the optoelectronic module 100, and FIG. 3B is a perspective view of a portion of the optoelectronic module 100 engaged with the retainer 150.

In the illustrated configuration, the retainer 150 surrounds a portion of the slider 116 and a portion of the housing 102 to retain the bail 114 in a fixed position (e.g., the engaged or locked position) with respect to the housing 102. The protrusions 154 surround a portion of the housing 102 and are engaged with the surface 160. In particular, the protrusions 154 abut the surface 160 to prevent the retainer 150 from moving in a direction along the longitudinal axis 106.

The protrusions 152 abut the bail 114 (e.g., at the handle 136) to prevent the bail 114 from rotating. Thus, in the illustrated configuration, the retainer 150 is positioned to abut a portion of the bail 114 (e.g., at the handle 136) to retain both the bail 114 and the slider 116 in a fixed position (e.g., the engaged or locked position) with respect to the housing 102. Accordingly, the retainer 150 may prevent the bail 114 from rotating and consequently the slider 116 from moving with respect to the housing 102 in a direction parallel to the longitudinal axis 106 to the disengaged or unlocked position (e.g., in a direction away from the electrical coupling 108).

The retainer 150 may be engaged with the housing 102 to prevent the bail 114 from rotating and the slider 116 from moving with respect to the housing 102 in a direction parallel to the longitudinal axis 106 to the disengaged or unlocked position (e.g., in a direction away from the electrical coupling 108). In the engaged or locked position shown in FIG. 3A, the protrusions 152 of the retainer 150 abuts a portion the bail 114 (in particular, the handle 136), thereby preventing the bail 114 from being rotated and moving with respect to the housing 102. Since the bail 114 is coupled to the slider 116, the retainer 150 also retains the slider 116 with respect to the housing 102. This in turn prevents the slider 116 from moving with respect to the housing 102 to deactivate or disable the release mechanism 117 of the slider 116, thereby preventing release of the optoelectronic module 100 from the cage 190.

When the protrusion 152 of the retainer 150 abuts the handle 136, the bail 114 is unable to rotate. In particular, the retainer 150 is positioned in a path of motion or path of rotation of the bail 114. Therefore, the bail 114, and in particular, the protrusion 152, obstructs the bail 114 so it cannot rotate while the retainer 150 is engaged with the optoelectronic module 100.

The body portion 156 may cover part of the lateral portion 118 and/or the resilient tab 120 of the slider 116. The sides 158 of the retainer 150 may be positioned to surround the optoelectronic module 100 and may extend generally parallel to the sides of the optoelectronic module 100 (e.g., sides of the housing 102 and the arms 110 of the slider 116). The retainer 150 may include rounded corners that generally correspond to the curvature of the slider 116 and/or the housing 102.

When the protrusions 154 are positioned against the surface 160 of the housing 102, the protrusions 154 abut the housing 102 to retain the retainer 150 with respect to the housing 102 (e.g., to prevent the retainer 150 from moving with respect to the housing 102, and vice versa). Further, when the protrusions 152 are positioned to abut the bail 114, the protrusions 152 retain the retainer 150 with respect to bail 114 and the slider 116 (e.g., to prevent the retainer 150 from moving with respect to the slider 116, and vice versa). Accordingly, when the retainer 150 is engaged with the housing 102 and the bail 114 (by the protrusions 152, 154), the slider 116 is retained with respect to the housing 102, thereby fixing the slider 116 with respect to the housing 102. Additionally or alternatively, when the retainer 150 is engaged with the housing 102 and the handle 136 (by the protrusions 152, 154), the handle 136 is retained with respect to the housing 102, thereby fixing the handle 136 with respect to the housing 102.

As mentioned above, the retainer 150 may be formed of a resilient material (such as a resilient metal material) to permit the retainer 150 to engage and disengage the optoelectronic module 100. To engage the retainer 150 with the optoelectronic module 100, the sides 158 may be spread apart, for example, by a user pulling the sides 158 apart. Spreading the sides 158 apart may permit the protrusions 152, 154 to clear the sides of the optoelectronic module 100 without interference. The retainer 150 may then be positioned around the optoelectronic module 100, for example, in the engaged position shown in FIGS. 3A and 3B. In the engaged position, the protrusions 154 are positioned to abut the surface 160 and the protrusions 152 are positioned to abut the bail 114. Once positioned to engage the optoelectronic module 100, the retainer 150 may return to its original shape, by virtue of the resilience of the retainer 150, to retain the bail 114 and the handle 136 with respect to the housing 102 (e.g., with the protrusions 152 positioned against the bail 114). In this position (e.g., the engaged position), the sides 158 of the retainer 150 may abut the arms 110 of the slider 116 and/or a portion of the handle 136.

To disengage or unlock the retainer 150 with respect to the optoelectronic module 100, the sides 158 may be spread apart (for example, by a user pulling the sides 158 apart), which in turn may remove the protrusions 152 away from the bail 114 and the protrusions 154 away from the surface 160, and may also permit the protrusions 152, 154 to clear the sides of the optoelectronic module 100 without interference. The retainer 150 may then be removed from contacting the optoelectronic module 100. With the retainer 150 removed, the bail 114 and the slider 116 may be actuated to remove the optoelectronic module 100 from the cage 190.

As mentioned above, FIG. 1D illustrates the optoelectronic module 100 with the retainer 150 removed, with the optoelectronic module 100 in a disengaged or unlocked position. When the retainer 150 is not engaged with the optoelectronic module 100 (e.g., by restricting movement of the bail 114), the slider 116 may move with respect to the housing 102 to the disengaged or unlocked position shown. For example, a user may move the slider 116 to the disengaged or unlocked position by pulling on the handle 136 of the bail 114, which is coupled to the slider 116.

In the disengaged or unlocked position, the slider 116 may be positioned further along the longitudinal axis 106 away from the electrical coupling 108, as shown. In this position, the protrusions 112 of the slider 116 may disengage the tabs 196 of the cage 190 to permit the optoelectronic module 100 to be removed from the cage 190. When the user continues to pull on the handle 136 of the bail 114, the entire optoelectronic module 100 will be pulled along with the bail 114, thereby removing the optoelectronic module 100 from the cage 190.

As explained above, the disclosed configurations of the retainer 150 may deactivate or disable the release mechanism 117 of the optoelectronic module 100, to prevent the optoelectronic module 100 from unintentionally releasing from the cage 190, for example, during shipping or transport. In particular, the retainer 150 may be implemented to deactivate or disable the bail 114, which is coupled to the slider 116 release mechanism 117, thereby preventing the optoelectronic module 100 from being removed from the cage 190, which may be implemented in a network switch. To deactivate or disable the slider 116 release mechanism 117, the retainer 150 retains the handle 136 of the bail 114 (which in turn is coupled to the slider 116) to prevent the bail 114 from rotating to the disengaged or unlocked position. Since the retainer 150 abuts the handle 136, the bail 114 is prevented from moving or rotating to the disengaged or unlocked position until the retainer 150 is removed.

In one example, a method of engaging the retainer 150 with the optoelectronic module 100 may include spreading the sides 158 of the retainer 150, for example, by a user pulling the sides 158 apart. Spreading the sides 158 apart may permit the protrusions 152, 154 to clear the sides of the optoelectronic module 100 without interference. The method may include positioning the retainer 150 around the optoelectronic module 100, for example, in the engaged position shown in FIGS. 3A-3B. In the engaged position, the protrusions 154 are positioned to abut the surface 160 and the protrusions 152 are positioned to abut the bail 114 and the handle 136. Once positioned to engage the optoelectronic module 100, the retainer 150 may return to its original shape, by virtue of the resilience of the retainer 150, to retain the slider 116 and the handle 136 with respect to the housing 102. In this position (e.g., the engaged position), the sides 158 of the retainer 150 may abut the arms 110 of the slider 116 and/or a portion of the bail 114.

In some aspects, the method of engaging the retainer 150 with the housing 102 may include abutting the protrusion 152 of the retainer 150 against the bail 114 and/or the handle 136, and abutting the protrusion 154 of the retainer 150 against the surface 160 of the housing 102. To deactivate or disable the slider 116 release mechanism 117, the retainer 150 engages the bail 114 and the housing 102 to prevent the slider 116 from moving to the disengaged or unlocked position. Since the retainer 150 abuts the bail 114 and is also secured to the housing 102 by the protrusions 152, the slider 116 is prevented from moving to the disengaged or unlocked position until the retainer 150 is removed.

In another example, a method of disengaging the retainer 150 with the optoelectronic module 100 may include spreading apart the sides 158 of the retainer 150 (for example, by a user pulling the sides 158 apart). The sides 158 may be coupled to one another by the body portion 156. The method may include removing the protrusions 154 away from the surface 160 (e.g., by pulling the sides 158 apart), which may in turn permit the protrusions 154 to clear the sides of the optoelectronic module 100 without interference. The method may include removing the protrusions 152 away from the bail 114 (e.g., by pulling the sides 158 apart), which may in turn permit the protrusions 152 to clear the sides of the optoelectronic module 100 without interference. The method may include removing the retainer 150 from contacting the optoelectronic module 100. With the retainer 150 removed, the bail 114 and the slider 116 may be actuated to remove the optoelectronic module 100 from the cage 190.

In some configurations, the protrusions 152 and the protrusions 154 may be integral with respect to the body of the retainer 150. That is, retainer 150 including the protrusions 152 and the protrusions 154 may be formed of a single piece of material. Additionally or alternatively, the sides 158 and the body portion 156 may be integral with respect to the body of the retainer 150. That is, retainer 150 including the sides 158 and the body portion 156 may be formed of a single piece of material.

In the illustrated configuration, two of the protrusions 152, 154 are included, with one on each side of the retainer 150. However, the retainer 150 may include any suitable number of the protrusions 152, 154. For example, the retainer 150 may include one protrusion, or more than two protrusions. Further, other suitable features besides protrusions may be implemented to engage with the housing 102.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic module comprising:
a housing enclosing at least one optical transmitter or receiver;
a slider configured to move with respect to the housing, the slider including at least one slider protrusion configured to engage a cage, wherein the cage is sized and shaped to receive the housing;
a bail rotatably coupled to the housing, the bail configured to actuate the slider when the bail is rotated; and
a retainer configured to engage with the housing and the bail to retain the bail in a fixed position with respect to the housing, wherein the retainer disables a release mechanism of the slider when engaged with the housing and the bail.

2. The optoelectronic module of claim 1, the retainer comprising a retainer protrusion configured to engage with a surface of the housing.

3. The optoelectronic module of claim 1, the retainer comprising a retainer protrusion configured to abut the bail when the retainer is engaged with the housing.

4. The optoelectronic module of claim 3, wherein the retainer protrusion abutting the bail prevents the bail from rotating.

5. The optoelectronic module of claim 1, the retainer comprising a body portion extending between two oppositely positioned sides.

6. The optoelectronic module of claim 5, the retainer further comprising a first protrusion and a second protrusion, positioned on the two oppositely positioned sides of the retainer.

7. The optoelectronic module of claim 6, wherein the first protrusion and the second protrusion extend transverse to the two oppositely positioned sides of the retainer.

8. The optoelectronic module of claim 6, wherein at least the first protrusion extends parallel to the body portion.

9. The optoelectronic module of claim 6, wherein the first protrusion and the second protrusion extend towards an interior of the retainer.

10. The optoelectronic module of claim 6, wherein the first protrusion disables the release mechanism of the slider when engaged with the bail by preventing the bail from rotating.

11. The optoelectronic module of claim 1, wherein the retainer abuts a portion of the bail when the retainer is engaged with the housing to retain both the bail and the slider in the fixed position with respect to the housing.

12. The optoelectronic module of claim 1, wherein the retainer prevents the bail from rotating when the retainer is engaged with the housing and consequently prevents the slider from moving with respect to the housing to an unlocked position.

13. The optoelectronic module of claim 1, wherein the retainer comprises a planar material bent into a u-shaped configuration, and the retainer is formed of a resilient material to permit the retainer to be engaged with the housing and the bail.

14. The optoelectronic module of claim 1, wherein the slider is configured to move in a direction parallel to a longitudinal axis of the housing, the slider includes at least one arm extending along the housing and the at least one slider protrusion positioned on the arm, the at least one slider protrusion configured to engage a corresponding resilient tab of the cage.

15. An optoelectronic module comprising:
a housing enclosing at least one optical transmitter or receiver;
a slider configured to move with respect to the housing, the slider including at least one slider protrusion configured to engage a cage, wherein the cage is sized and shaped to receive the housing;
a bail rotatably coupled to the housing, the bail configured to actuate the slider when the bail is rotated; and
a retainer configured to engage with the housing and the bail to retain the bail in a fixed position with respect to the housing, wherein the retainer is sized and shaped to surround at least a portion of both the bail and the slider in an engaged position.

16. The optoelectronic module of claim 15, wherein the retainer disables a release mechanism of the slider when engaged with the housing and the bail.

17. The optoelectronic module of claim 15, the retainer comprising at least one of:
a first protrusion configured to engage with a surface of the housing; and
a second protrusion configured to abut the bail when the retainer is engaged with the housing, wherein the second protrusion abutting the bail prevents the bail from rotating.

18. The optoelectronic module of claim 15, the retainer comprising:
a body portion extending between two oppositely positioned sides; and
a first protrusion and a second protrusion, positioned on the two oppositely positioned sides of the retainer.

19. The optoelectronic module of claim 18, wherein at least one of:
the first protrusion and the second protrusion extend transverse to the two oppositely positioned sides of the retainer;
at least the first protrusion extends parallel to the body portion;
the first protrusion and the second protrusion extend towards an interior of the retainer; and
the first protrusion disables a release mechanism of the slider when engaged with the bail by preventing the bail from rotating.

20. The optoelectronic module of claim 15, wherein at least one of:
the retainer abuts a portion of the bail when the retainer is engaged with the housing to retain both the bail and the slider in the fixed position with respect to the housing;
the retainer prevents the bail from rotating when the retainer is engaged with the housing and consequently prevents the slider from moving with respect to the housing to an unlocked position;
the retainer comprises a planar material bent into a u-shaped configuration, and the retainer is formed of a resilient material to permit the retainer to be engaged with the housing and the bail; and
the slider is configured to move in a direction parallel to a longitudinal axis of the housing, the slider includes at least one arm extending along the housing and the at least one slider protrusion positioned on the arm, the at least one slider protrusion configured to engage a corresponding resilient tab of the cage.

21. A method comprising:
spreading apart sides of a retainer, wherein the sides of the retainer are coupled to one another by a body portion;
positioning a first protrusion of the retainer against a surface of a housing of an optoelectronic module; and
preventing a bail from rotating thereby disabling a slider coupled to the bail by abutting a second protrusion against the bail of the optoelectronic module;
wherein the retainer retains the bail with respect to the housing.

22. The method of claim 21, further comprising surrounding at least a portion of the housing and the bail by the retainer.

23. A method, comprising:
spreading apart sides of a retainer, wherein the sides of the retainer are coupled to one another by a body portion;
positioning a first protrusion of the retainer against a surface of a housing of an optoelectronic module; and
abutting a second protrusion against a bail of the optoelectronic module, wherein the second protrusion of the retainer abuts a handle of the bail to prevent the bail from rotating;
wherein the retainer retains the bail with respect to the housing.

24. The method of claim 23, wherein abutting the retainer against the bail of the optoelectronic module prevents the bail from rotating thereby disabling a slider coupled to the bail.

* * * * *